(12) United States Patent
Mok et al.

(10) Patent No.: US 10,716,312 B2
(45) Date of Patent: Jul. 21, 2020

(54) ETHYLENE DISPOSAL APPARATUS AND ETHYLENE DISPOSAL METHOD USING SAME

(71) Applicant: Korea Basic Science Institute, Daejeon (KR)

(72) Inventors: Young Sun Mok, Jeju-si (KR); Quang Hung Trinh, Jeju-si (KR); Suk Jae Yoo, Gunsan-si (KR)

(73) Assignee: Korea Basic Science Institute, Daejeon (KR)

( * ) Notice: Subject to any disclaimer, the term of this patent is extended or adjusted under 35 U.S.C. 154(b) by 446 days.

(21) Appl. No.: 15/521,301

(22) PCT Filed: Oct. 22, 2015

(86) PCT No.: PCT/KR2015/011185
§ 371 (c)(1),
(2) Date: Apr. 24, 2017

(87) PCT Pub. No.: WO2016/064211
PCT Pub. Date: Apr. 28, 2016

(65) Prior Publication Data
US 2017/0325471 A1   Nov. 16, 2017

(30) Foreign Application Priority Data
Oct. 24, 2014   (KR) .................. 10-2014-0144961

(51) Int. Cl.
*A23B 7/015* (2006.01)
*H05H 1/24* (2006.01)
*H01J 37/32* (2006.01)

(52) U.S. Cl.
CPC ........ *A23B 7/015* (2013.01); *H01J 37/32036* (2013.01); *H01J 37/32348* (2013.01);
(Continued)

(58) Field of Classification Search
None
See application file for complete search history.

(56) References Cited

U.S. PATENT DOCUMENTS

| | | | |
|---|---|---|---|
| 2002/0074221 A1* | 6/2002 | Mallinson | B01D 53/02 204/170 |
| 2003/0150709 A1* | 8/2003 | LaBarge | B01D 53/9431 204/164 |

(Continued)

FOREIGN PATENT DOCUMENTS

| | | |
|---|---|---|
| CN | 102179145 | 9/2011 |
| CN | 103974758 | 8/2014 |

(Continued)

OTHER PUBLICATIONS

Notification of Reasons for Refusal dated Feb. 26, 2018 From the Japan Patent Office Re. Application No. 2017-540955 and Its Translation Into English. (12 Pages).

(Continued)

*Primary Examiner* — Kishor Mayekar

(57) ABSTRACT

The present invention relates to an ethylene disposal apparatus comprising: a plasma discharge part having an inlet and an outlet and being filled with an adsorbent; and an electrode part for generating plasma inside the plasma discharge part, wherein the adsorbent has a catalyst supported thereon. The present invention relates to an ethylene disposal method using the ethylene disposal apparatus, the method comprising the steps of: (a) injecting ethylene-containing gas into a plasma discharge part filled with the adsorbent; (b) applying voltage to the electrode part and generating plasma in the plasma discharge part, thereby degrading the injected ethylene; and (c) cooling the plasma discharge part.

4 Claims, 4 Drawing Sheets

(52) U.S. Cl.
CPC ......... *H01J 37/32844* (2013.01); *H05H 1/24* (2013.01); *Y02C 20/30* (2013.01)

(56) References Cited

U.S. PATENT DOCUMENTS

| | | | |
|---|---|---|---|
| 2005/0180906 A1 | 8/2005 | Muroi et al. | |
| 2005/0214181 A1* | 9/2005 | Kaneko | B01D 53/32 422/186.04 |
| 2005/0244310 A1* | 11/2005 | Tamura | B01D 53/32 422/186.21 |
| 2014/0069853 A1* | 3/2014 | Lee | C02F 1/4672 210/149 |

FOREIGN PATENT DOCUMENTS

| | | |
|---|---|---|
| EP | 2759330 | 7/2014 |
| JP | 11-319486 | 11/1999 |
| JP | 2002-011111 | 1/2002 |
| JP | 2005-138075 | 6/2005 |
| JP | 2005-138076 | 6/2005 |
| JP | 2006-320827 | 11/2006 |
| JP | 2007-000733 | 1/2007 |
| JP | 2007-120877 | 5/2007 |
| JP | 2008-245739 | 10/2008 |
| KR | 10-2004-0010895 | 2/2004 |
| KR | 10-2004-0064933 | 7/2004 |
| KR | 10-0492398 | 5/2005 |
| WO | WO 2004/112940 | 12/2004 |

OTHER PUBLICATIONS

Supplementary European Search Report and the European Search Opinion dated Apr. 26, 2018 From the European Patent Office Re. 15852309.2. (8 Pages).

International Search Report and the Written Opinion dated Feb. 5, 2016 From the Korean Intellectual Property Office Re. Application No. PCT/KR2015/011185 and Its Translation of Search Report Into English. (11 Pages).

Notification of Office Action and Search Report dated Jan. 13, 2020 From the National Intellectual Property Administration of the People's Republic of China Re. Application No. 2015800578512 and Its Translation of Office Action Into English. (11 Pages).

* cited by examiner

ETHYLENE DISPOSAL APPARATUS AND ETHYLENE DISPOSAL METHOD USING SAME

RELATED APPLICATIONS

This application is a National Phase of PCT Patent Application No. PCT/KR2015/011185 having International filing date of Oct. 22, 2015, which claims the benefit of priority of Korean Patent Application No. 10-2014-0144961 filed on Oct. 24, 2014. The contents of the above applications are all incorporated by reference as if fully set forth herein in their entirety.

TECHNICAL FIELD AND BACKGROUND OF THE INVENTION

The present invention relates to an ethylene disposal apparatus capable of disposing of ethylene generated in a facility for storing an agricultural product, and a method of disposing of ethylene.

In general, agricultural products are harvested locally, sold to a central market through intermediary collectors, and then supplied to consumers through wholesalers and retailers. In this distribution process, a large amount of agricultural products are stored in a low-temperature warehouse for a short time or a long time.

Meanwhile, fruits and vegetables among agricultural products stored in the warehouse are not able to be stored for a long period because they will rot by decomposition or rapidly shrivel due to ethylene gas ($C_2H_2$) naturally generated in the atmosphere. Therefore, since are difficult to store fruits and vegetables for a long period, and thus it is difficult to adjust the timing of delivery, it is difficult to set the supply amount according to demand, resulting in financial loss to farmers due to a decrease in product value caused by decomposition.

In order to solve the aforementioned problems, an ethylene gas neutralizing agent has been developed and used, and accordingly, an apparatus for dispersing the ethylene gas neutralizing agent in a storehouse is required. The related art includes an air conditioner for an agricultural product storehouse as disclosed in Korean Patent No. 10-0745142 (hereinafter, referred to as the related art).

The above-described related art is effective in suppressing the decomposition of agricultural products by dispersing a neutralizing agent which can suppress ethylene gas which promotes the decomposition of agricultural products in a storehouse, and has an advantage in which the prices of agricultural products can be stabilized by increasing a storage period compared to the conventional period and thus controlling the timing of delivery and sales of agricultural products.

However, additional neutralizing agents need to be continuously used to suppress ethylene gas; various bacteria, odors, airborne fungal spores and the like other than ethylene gas cannot be disposed of; and humidity can also not be adjusted. Therefore, it is difficult to store crops under optimum conditions which can maintain freshness.

In addition, a low-temperature plasma process may be used to decompose ethylene. The above-described low-temperature plasma process is effective in decomposing ethylene, but power is continuously consumed due to continuous operation, and harmful byproducts such as aldehydes, organic acids and the like are generated upon the plasma decomposition of ethylene to deteriorate the air quality of a facility for storing an agricultural product.

SUMMARY OF THE INVENTION

The present invention is directed to providing an ethylene disposal apparatus, and a method of disposing of ethylene, which does not produce harmful byproducts and can reduce operating costs by minimizing power consumption.

The present invention provides an ethylene disposal apparatus, which includes a plasma discharge part having inlets and an outlet and filled with an adsorbent therein; and an electrode part configured to generate plasma inside the plasma discharge part, wherein the adsorbent supports a catalyst.

The present invention provides a method of disposing of ethylene using the ethylene disposal apparatus, which comprises (a) injecting ethylene-containing gas into the plasma discharge part filled with the adsorbent; (b) applying voltage to the electrode part and generating plasma in the plasma discharge part to decompose the injected ethylene; and (c) cooling the plasma discharge part.

In the present invention, ethylene is accumulated on an adsorbent supporting a catalyst, and thus the ethylene can be decomposed through composite actions of plasma and a catalyst in a short amount of time, and the ethylene can also be decomposed without the production of harmful byproducts.

BRIEF DESCRIPTION OF THE SEVERAL VIEW OF THE DRAWINGS

DESCRIPTION OF SPECIFIC EMBODIMENTS OF THE INVENTION

Figure 1:
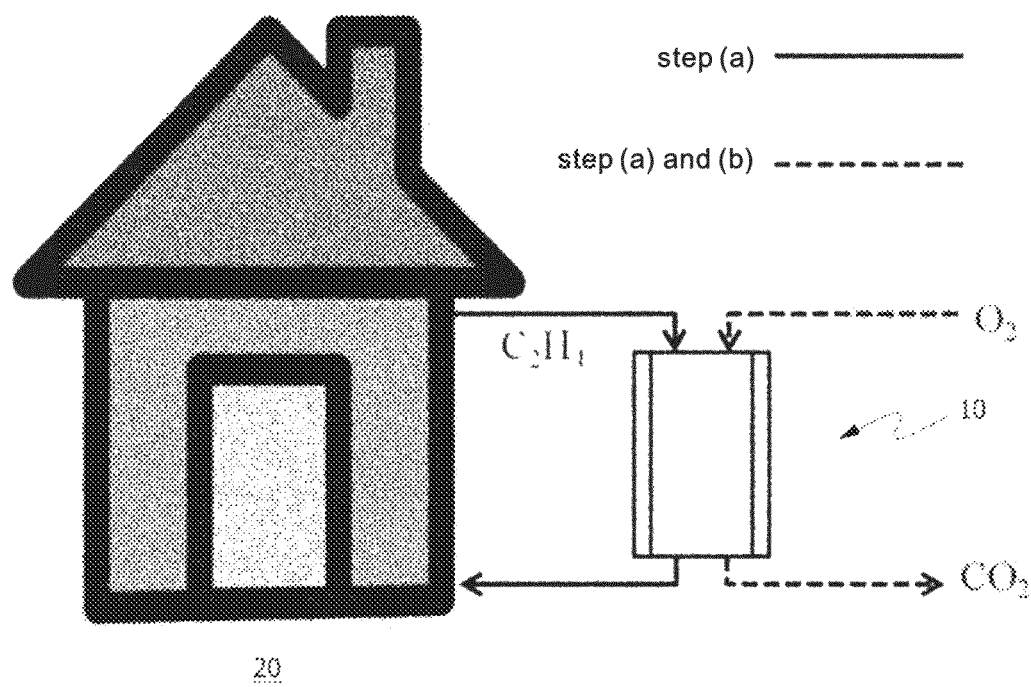
FIG. 1 is a schematic diagram of an ethylene disposal apparatus according to an embodiment of the present invention.

The present invention relates to an ethylene disposal apparatus, which includes a plasma discharge part having inlets and an outlet and filled with an adsorbent therein; and an electrode part configured to generate plasma inside the plasma discharge part, wherein the adsorbent supports a catalyst.

In particular, the plasma discharge part may further include a coil having a conductive region formed at a predetermined area and formed to wrap around an outer surface of the plasma discharge part in the conductive region. Here, the coil may be made of a copper wire, an iron wire or an aluminum wire and come in contact with a ground electrode.

In addition, the plasma discharge part may be made of a quartz tube, a glass tube, an alumina tube or a ceramic tube. The electrode part may extend into an inside passage of the plasma discharge part and may be a metal rod with the same axis as the plasma discharge part. Also, the electrode part may be connected with a voltage supplying device which supplies power to the plasma discharge part to generate plasma.

Meanwhile, the adsorbent may be alumina, zeolite or a mixture thereof, and may be formed in a spherical shape or pellet form. Also, the catalyst may be any one of manganese dioxide ($MnO_2$), copper oxide (CuO), iron oxide ($Fe_2O_3$), silver oxide ($Ag_2O$), vanadium pentoxide ($V_2O_5$), zinc oxide (ZnO) and titanium dioxide ($TiO_2$) or a mixture thereof. Here, the catalyst may be supported on the adsorbent at a mass fraction of 0.2 to 10 wt %.

In addition, the present invention relates to a method of disposing of ethylene using the ethylene disposal apparatus, which includes (a) injecting ethylene-containing gas into the plasma discharge part filled with the adsorbent; (b) applying voltage to the electrode part and generating plasma in the plasma discharge part to decompose the injected ethylene; and (c) cooling the plasma discharge part.

Furthermore, the ethylene-containing gas may be accumulated on the adsorbent supporting the catalyst.

In particular, the step of decomposing ethylene may include introducing oxygen into a plasma reaction part and reacting the ethylene with the oxygen so as to oxidize the ethylene and oxygen into carbon dioxide and water vapor. Here, the decomposition of ethylene may be performed at 30 to 90° C.

Hereinafter, exemplary embodiments of the present invention will be described in detail with reference to the accompanying drawings. Moreover, terms and words used in this specification and claims should not be interpreted as limited to commonly used meanings or meanings in dictionaries and should be interpreted with meanings and concepts which are consistent with the technological scope of the invention based on the principle that the inventors have appropriately defined concepts of terms in order to describe the invention in the best way.

Therefore, since the embodiments described in this specification and configurations illustrated in the drawings are only exemplary embodiments and do not represent the overall technological scope of the invention, it should be understood that the invention covers various equivalents, modifications, and substitutions at the time of filing of this application.

Figure 2:
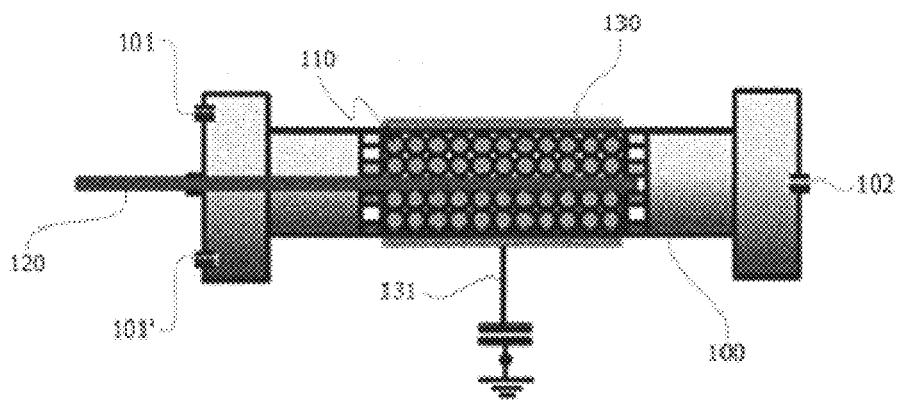
FIG. 2 is a diagram illustrating a configuration of an ethylene disposal apparatus according to an embodiment of the present invention.
Figure 3:
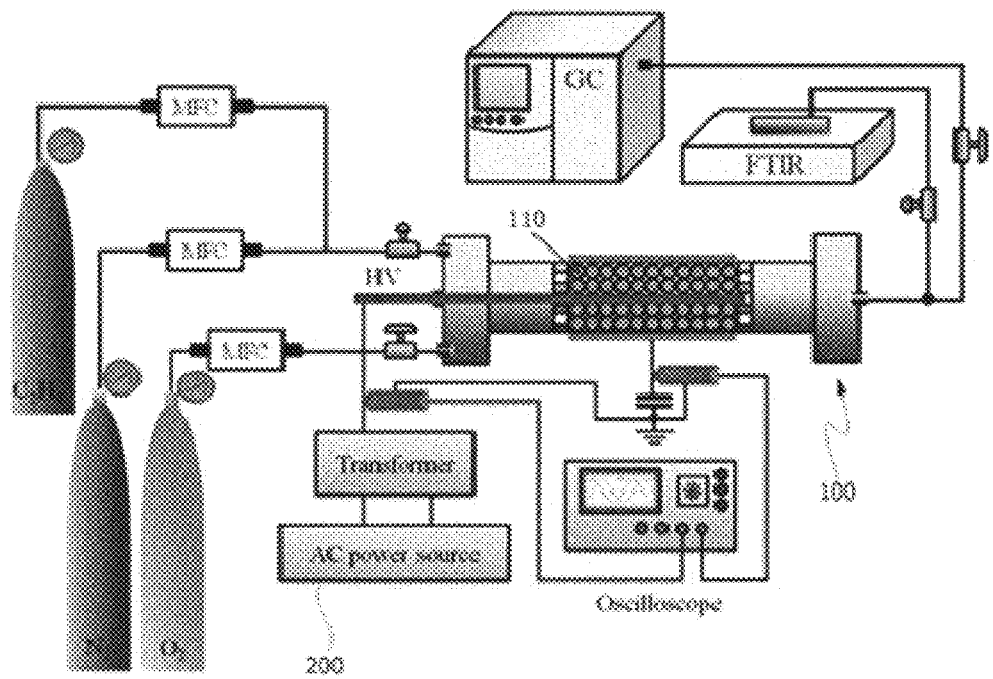
FIG. 3 is a diagram illustrating a configuration of an ethylene disposal apparatus according to an embodiment of the present invention.
Figure 4:
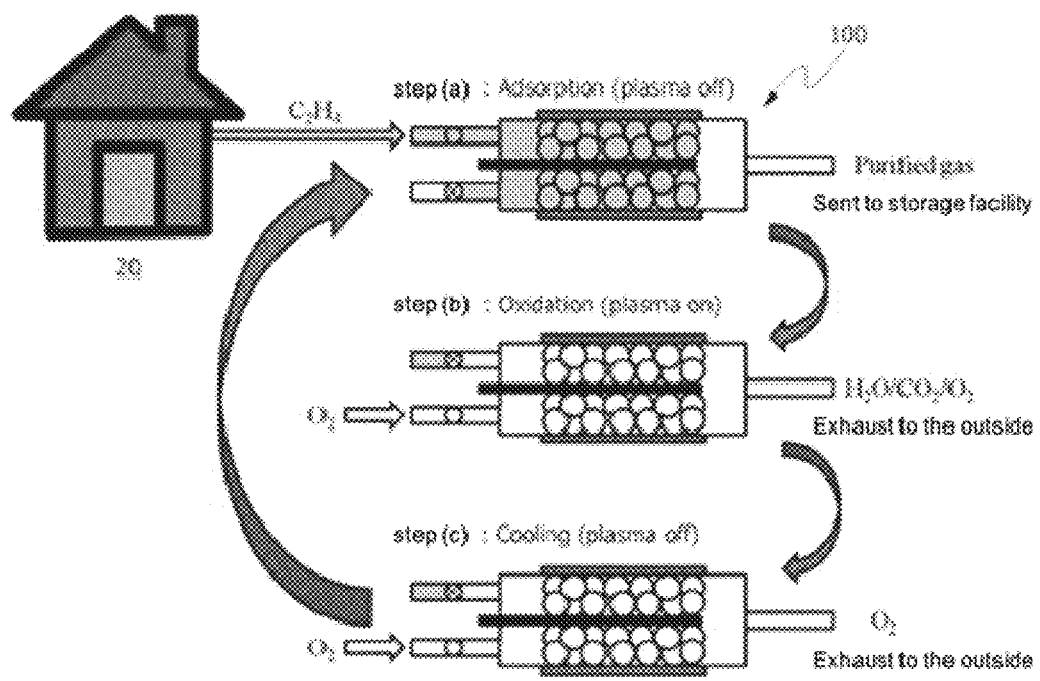
FIG. 4 is a schematic diagram of an ethylene disposal method according to an embodiment of the present invention.
Figure 5:
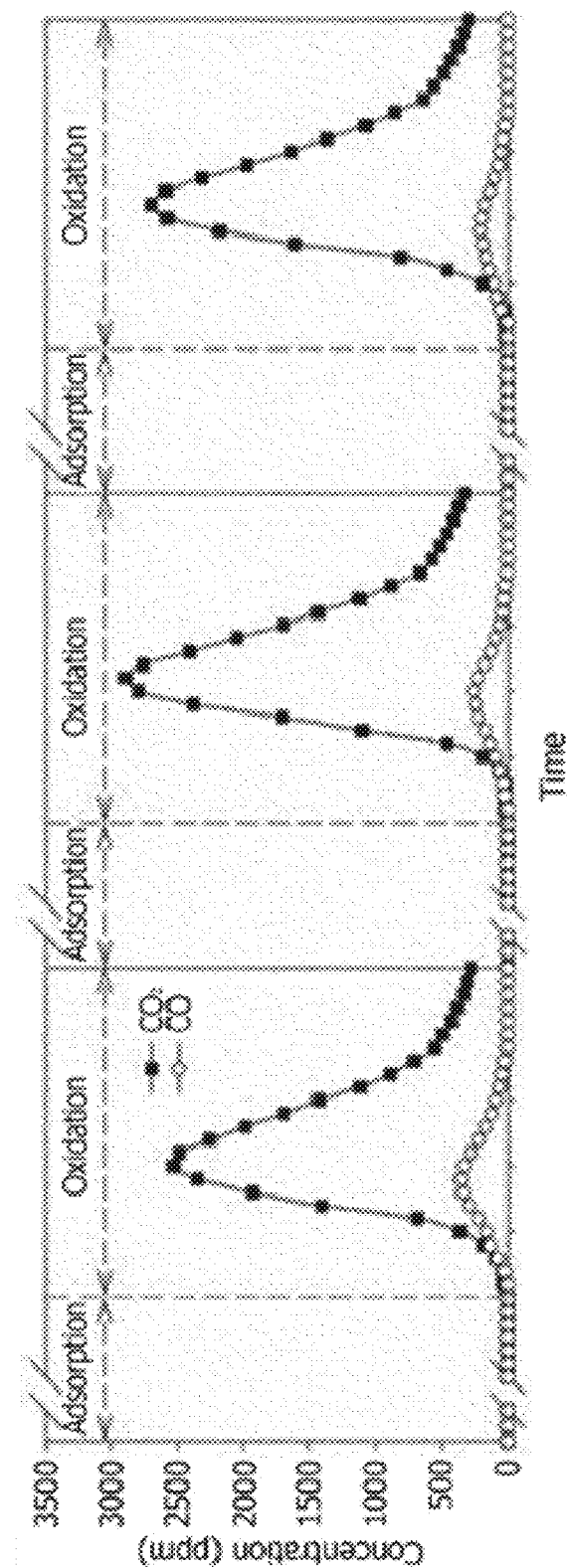
FIG. 5 is a graph illustrating concentrations of $CO_2$ and CO during the decomposition of accumulated ethylene through composite actions of plasma and a catalyst in an embodiment of the present invention.
Figure 6:
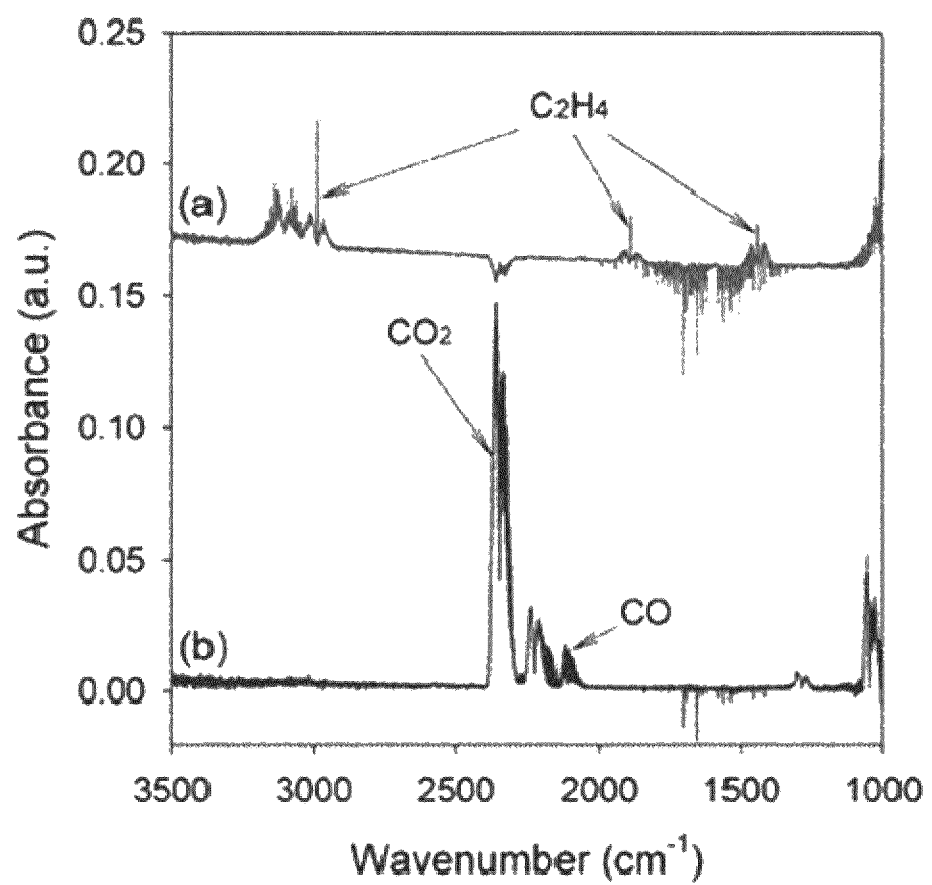
FIG. 6 is a graph illustrating (a) an FTIR spectrum of ethylene and (b) an FTIR spectrum when adsorbed ethylene is disposed of through composite actions of plasma and a catalyst.

FIG. 1 is a schematic diagram of an ethylene disposal apparatus according to an embodiment of the present invention, FIG. 2 is a diagram illustrating a configuration of an ethylene disposal apparatus according to an embodiment of the present invention, FIG. 3 is a diagram illustrating a configuration of an ethylene disposal apparatus according to an embodiment of the present invention, FIG. 4 is a schematic diagram of an ethylene disposal method according to an embodiment of the present invention, FIG. 5 is a graph illustrating concentrations of $CO_2$ and CO during the decomposition of accumulated ethylene through composite actions of plasma and a catalyst in an embodiment of the present invention, and FIG. 6 is a graph illustrating (a) an FTIR spectrum of ethylene and (b) an FTIR spectrum when absorbed ethylene is disposed of through composite actions of plasma and a catalyst. Hereinafter, the ethylene disposal apparatus and the method of disposing of ethylene according to the present invention will be described in detail with reference to FIGS. 1 to 6 and the examples.

The present invention, as shown in FIG. 1, relates to an ethylene disposal apparatus capable of disposing of ethylene generated in a facility for storing an agricultural product 20, and a method of disposing ethylene. More specifically, ethylene generated in the facility for storing an agricultural product 20 may be reacted with oxygen through composite actions of plasma and a catalyst in an ethylene disposal apparatus 10, and thus oxidized into carbon dioxide and water vapor to dispose of the ethylene.

As shown in FIG. 2, the ethylene disposal apparatus 10 according to the present invention is composed of a plasma discharge part 100 and an electrode part 120. Here, the plasma discharge part 100 includes an adsorbent 110 supporting a catalyst.

Here, the adsorbent 110 refers to a material which absorbs a gaseous or liquid adsorbate. In the present invention, the adsorbent 110 is for adsorbing ethylene, in which a detailed description of the adsorbent 100 will be described below.

The plasma discharge part 100 according to the present invention may be in a cylindrical form, and includes an inlet 101 formed in one side and configured to introduce ethylene-containing gas and air and an outlet 102 formed on the other side and configured to discharge purified air. In one example, the inlet 101 may include at least two inlets, wherein an inlet configured to introduce ethylene-containing gas may be referred to as a first inlet 101, and an inlet configured to introduce air may be referred to as a second inlet 101'.

In addition, the plasma reaction part according to the present invention is made of a tube having a relative dielectric constant capable of generating plasma, for example, a quartz tube, a glass tube, an alumina tube or a ceramic tube. In one example, the plasma reaction part may be a quartz tube.

Additionally, the plasma discharge part 100 may further include a coil 130 having a conductive region formed at a predetermined area and formed to wrap around an outer surface of the plasma discharge part 100 in the conductive region. Here, the coil 130 may be made of a conductor such as a copper wire, an iron wire, an aluminum wire or the like. Also, high frequency power is supplied to the electrode part 120 corresponding to the conductive region in the plasma discharge part 100, thereby discharging may occur smoothly. In particular, the adsorbent 110 may be filled only in the conductive region.

Furthermore, the coil 130 may come in contact with a ground electrode 131. Here, the ground electrode 131 refers to an electrode which is buried in the ground for grounding and may be a metal rod, a metal plate or a metal mesh. In the present invention, a Y-shaped ground electrode 131 may be used.

In a specific aspect, the electrode part 120 according to the present invention extends into an inside passage of the plasma discharge part 100 and may be a metal rod with the same axis as the plasma discharge part 100. Also, the metal rod may be made of stainless steel, copper, brass, bronze, tungsten or molybdenum.

Referring to FIG. 3, the electrode part 120 may be connected with a voltage supplying device 200, which supplies power to the plasma discharge part 100 to generate plasma. Here, the voltage supplying device 200 may additionally be connected with an oscilloscope to output a change in input voltage over time on a screen.

Meanwhile, the adsorbent 110 according to the present invention is for accumulating ethylene and may be included in the plasma discharge part 100. In particular, when gas is brought into a plasma state due to the generation of plasma, various active components such as radicals, ions, high-energy electrons, and molecules in an excited state are produced, and these active components are involved in a decomposition initiation reaction or the oxidation of a decomposition intermediate of ethylene, thereby ethylene is finally oxidized into carbon dioxide. Here, the adsorbent 110 may be alumina, zeolite or a mixture thereof and may be formed in a spherical shape or pellet form. In one example, the adsorbent 110 may be zeolite in a pellet form.

In particular, the zeolite may be a 4A, Y, 13X, beta or gamma type zeolite.

In addition, since the catalyst supported on the adsorbent 110 is activated by plasma and thus exhibits catalysis even at low temperatures, the accumulated ethylene can be decomposed more quickly. In particular, the catalyst may be supported on the adsorbent 110 at a mass fraction of 0.2 to 10 wt %, and ethylene which is accumulated on the adsorbent 110 may be decomposed by the generation of plasma and thus produces $H_2O$ and $CO_2$. Here, the catalyst may be any one of manganese dioxide ($MnO_2$), copper oxide (CuO), iron oxide ($Fe_2O_3$), silver oxide ($Ag_2O$), vanadium pentoxide ($V_2O_5$), zinc oxide (ZnO) and titanium dioxide ($TiO_2$) or a mixture thereof.

Furthermore, a catalyst used to dispose ethylene in the facility for storing an agricultural product 20 should be used at room temperature unlike a catalyst for a synthesis reaction, and thus requires low-temperature activity and durability as well as reliability. Therefore, it is preferable for the catalyst to have a structure capable of increasing mechanical stability. In particular, a nano-scale catalyst may be supported on the adsorbent 110 to increase mechanical stability in the present invention, and plasma instead of heat may be used for low-temperature activity of the catalyst so that the catalyst can be activated even at low temperatures. More specifically, a reaction temperature in the present invention may be 30 to 90° C. In an embodiment of the present invention, zeolite may be used as the adsorbent 110, and a nano-scale silver oxide ($Ag_2O$) may be used as the catalyst.

In particular, the zeolite has a highly specific surface area. Therefore, when the silver oxide ($Ag_2O$) is supported on the zeolite, a highly dispersed nano-catalyst may be prepared, and when the nano-scale silver oxide ($Ag_2O$) is supported on the zeolite adsorbent 110, adsorbability significantly increases, and thus, ethylene may accumulate in large amounts for a long time.

Hereinafter, a method of disposing ethylene using the ethylene disposal apparatus according to the present invention will be described in detail with reference to the accompanying drawings.

The method of disposing of ethylene according to the present invention has very low power consumption because power is only consumed for the short time in which ethylene accumulated on the adsorbent 110 is decomposed, and contributes to rapid disposal of ethylene because ethylene is also decomposed by catalysis due to a catalytic activation effect of the plasma. In particular, harmful byproducts such as aldehydes or organic acids are barely produced by catalysis, and decomposed ethylene is completely oxidized into carbon dioxide.

Referring to FIG. 4, the method of disposing ethylene according to the present invention includes (a) injecting ethylene-containing gas into the plasma discharge part 100, (b) generating plasma in the plasma discharge part 100 to decompose the injected ethylene, and (c) cooling the plasma discharge part 100. In particular, a cycle of the three steps may be repeated.

The adsorbent 110 should be filled before ethylene-containing gas is injected into the plasma discharge part 100, and then ethylene-containing gas should be injected into the plasma discharge part 100 filled with the adsorbent 110. If so, the ethylene-containing gas may be accumulated on the adsorbent 110 supporting a catalyst. In particular, ethylene exhibits low adsorbability with respect to a general adsorbent 110 due to its high vapor pressure, but it is possible to increase adsorbability when a nano-scale catalyst is supported on zeolite or alumina as in the present invention.

In this case, ethylene-removed gas which is not accumulated on the adsorbent 110 may be re-circulated through the facility for storing an agricultural product 20, and when this operation is completed, the inlet 101 is blocked so that ethylene gas cannot be introduced into the plasma discharge part 100.

In addition, in the step of decomposing ethylene, voltage is applied to the electrode part 120 according to the present invention, and thus plasma may be generated in the plasma discharge part 100. Meanwhile, in the step of decomposing ethylene, voltage is applied and simultaneously air may be introduced into the plasma. That is, AC high voltage is applied while air is introduced into the plasma discharge part 100, and thus ethylene accumulated on the adsorbent 110 may be oxidized into carbon dioxide and water vapor.

$$C_2H_2+3O_2 \rightarrow 2CO_2+2H_2O \qquad \text{(Reaction Formula)}$$

In particular, the frequency of high AC voltage applied to the electrode part 120 needs to be controlled appropriately. When frequency is too high, power may be inefficiently consumed due to electrical matching problems. On the other hand, when frequency is too low, plasma may not be generated and thus gas may not be activated. Therefore, taking into consideration such points comprehensively, it is preferable for the frequency applied to the electrode part 120 to be 50 to 1000 Hz.

In this case, the produced carbon dioxide and water vapor are preferably exhausted to the outside. More specifically, since carbonic acid is generated when the produced carbon dioxide and water vapor are re-introduced into the facility for storing an agricultural product 20, an inside of the storage facility may be acidified. Therefore, this prevents acidification.

In a specific aspect, since voltage is applied in the step of decomposing ethylene, the plasma discharge part 100 may be heated to 30 to 90° C.

In addition, the step of cooling the plasma discharge part 100 may be performed because the adsorbability of the adsorbent 110 with respect to ethylene is degraded at high temperatures. In this case, the plasma discharge part 100 may be cooled to 15 to 40° C., and after the cooling, ethylene-containing gas is injected again into the plasma discharge part including the adsorbent 110, and thus ethylene is accumulated on the adsorbent 110. Moreover, this process may be repeated.

Meanwhile, after-ripening of agricultural products is facilitated by ethylene, but agricultural products are also decomposed by various microorganisms. The ethylene disposal apparatus according to the present invention offers performance in which various microorganisms which are suspended in air of the facility for storing an agricultural product can be sterilized through composite actions of plasma and a catalyst in addition to the carrying out ethylene disposal. Therefore, the two goals of ethylene disposal and sterilization can be achieved through one device.

Hereinafter, experimental examples will be described in detail to promote an understanding of the present invention. However, the following experimental examples are only exemplary, and the scope of the present invention is not limited to the following experimental examples. Experimental examples of the present invention are provided so that this disclosure will be thorough and complete, and will fully convey the concept of embodiments to those skilled in the art.

EXPERIMENTAL EXAMPLES

Experimental Example 1

Experimental Material

In the experimental examples of the present invention, zeolite (Cosmo Fine chemicals Co., Ltd.) was used as an adsorbent. More particularly, a total of 4 types of zeolite, 4A, Y, 13X and beta, were compared, and as a result, the 13X zeolite which has the most excellent adsorbability with respect to ethylene was used to support (adsorbent) a catalyst. Here, the 13X (Molecular Sieve 13X) zeolite had a specific surface area of about 500 $m^2/g$.

Simulated ethylene gas was prepared by mixing nitrogen and ethylene. Specifically, 1 L/min of nitrogen and 0.22 $cm^3$/min of ethylene were mixed to prepare ethylene gas with a concentration of 220 ppm. The actual concentration of ethylene suitable for use in a facility for storing an agricultural product is less than 20 ppm, which is much lower than 220 ppm.

Experimental Example 2

Disposing Ethylene in a Facility for Storing Agricultural Products Using an Ethylene Disposal Apparatus In experimental examples of the present invention, ethylene in a facility for storing an agricultural product was disposed of using an ethylene disposal apparatus.

First, in a state in which high voltage was not supplied to a plasma reaction part, simulated ethylene gas was introduced into the plasma reaction part for a predetermined time so that ethylene was accumulated on zeolite (step 1). Here, a flow rate when the simulated ethylene gas was introduced into the plasma reaction part was 1 L/min.

The step of injecting the simulated ethylene gas was terminated and the introduction of the simulated ethylene gas was stopped. Instead of the simulated ethylene gas, air (nitrogen: 80% and oxygen: 20%) was supplied at a flow rate of 1 L/min. At the same time, high voltage was applied to an electrode part 120 to generate plasma in the plasma discharge part (step 2). AC high voltage was supplied through an AC power source supply and an electric transformer, and the voltage was observed using an oscilloscope (Tektronix TDS3032). After this step was completed, the plasma discharge part was naturally cooled for 5 minutes (step 3).

Here, the supplied high voltage was 18.5 kV based on an effective value, and discharge power measured by a voltage-charge plot was about 17 W. Also, an AC high voltage supplying apparatus used in the experimental examples of the present invention had a frequency of 400 Hz.

Meanwhile, 32 ppm of ethylene was adsorbed and accumulated on zeolite for 500 minutes in step 1, and the accumulated ethylene was decomposed through composite actions of plasma and a catalyst for 25 minutes in step 2. A temperature of the plasma discharge part increased to about 90° C. due to plasma action in step 2, and thus the plasma discharge part was naturally cooled to 15 to 40° C. for 5 minutes in step 3. Steps 1 to 3 were then repeated three times to decompose ethylene.

In particular, 90 W power was consumed (discharge power: 17 W) in step 2, but the time used to consume the power was 25 minutes, which is very short. Therefore, it can be seen that power consumption is very low based on the total disposal process (530 minutes).

The disposed gas was exhausted through an outlet of the ethylene disposal apparatus, and was analyzed sequentially through a Fourier-transform infrared spectrometer (FTIR; Bruker IFS 66/S) and a gas chromatograph (GC; Bruker 450 GC).

FIG. 5 is a graph illustrating concentrations of $CO_2$ and CO generated when adsorbed and accumulated ethylene is decomposed through composite actions of plasma and a catalyst. Referring to FIG. 5, it can be seen that most ethylene adsorbed and accumulated on zeolite in step 1 was oxidized into carbon dioxide in step 2. It can be seen that a small amount of carbon monoxide in addition to carbon dioxide was observed and similar concentrations of $CO_2$ and CO were observed even when the cycle was repeated two or three times. More specifically, it can be seen that $CO_2$ accounted for 93.2% of the total gas exhausted through the outlet, and CO accounted for 6.8%. Here, it can be seen that an amount of generated CO was much lower than that of $CO_2$.

Experimental Example 3

Energy Yield

Energy yield refers to an amount of disposed ethylene/applied electric energy. When 32 ppm of ethylene was adsorbed and accumulated for 500 minutes, a total amount of adsorbed ethylene was 18.7 mg, and electric energy applied in the decomposition step using plasma and a catalyst for 20 minutes (1200 seconds) was 17 W×1200 sec=20400 J (20.4 kJ). Therefore, the energy yield was 0.92 mg/kJ. Unlike the present invention, when 32 ppm of ethylene was continuously disposed of at 17 W for 500 minutes, an energy yield was 0.037 mg/kJ.

Therefore, it can be seen that the present invention is more economical than the case in which ethylene was disposed of through continuous plasma treatment.

Experimental Example 4

FTIR Spectrum of Ethylene

FIG. 6 illustrates (a) a FTIR spectrum of ethylene and (b) an FTIR spectrum when absorbed ethylene is disposed of through composite actions of plasma and a catalyst. As shown in FIG. 6, harmful byproducts caused by ethylene were hardly produced. This means that an intermediate oxide of ethylene was oxidized into $CO_2$ or CO through composite actions of plasma and a catalyst.

| List of Reference Numerals |
| --- |
| 10: ethylene disposal apparatus<br>20: facility for storing an agricultural product |

-continued

List of Reference Numerals

| 100: plasma discharge part | 101, 101': inlet |
| 102: outlet | 110: adsorbent |
| 120: electrode part | 130: coil |
| 131: ground electrode | |
| 200: voltage supplying device | |

What is claimed is:

1. An ethylene disposal apparatus, comprising:
a facility for storing an agricultural product, wherein ethylene is generated in the facility;
a plasma discharge part having inlets and an outlet and filled with an adsorbent therein, and directly connected to the facility for storing an agricultural product through one of the inlets, wherein air is introduced into other inlet of the inlets; and
an electrode part configured to generate plasma inside the plasma discharge part,
wherein the adsorbent supports silver oxide ($Ag_2O$) as a catalyst,
wherein ethylene generated in the facility for storing an agricultural product is reacted with oxygen of air and decomposed into carbon dioxide and water vapor through composite actions of the plasma and the catalyst in the plasma discharge part;
wherein the plasma discharge part further includes a coil having a conductive region formed at a predetermined area and formed to wrap around an outer surface of the plasma discharge part in the conductive region,
wherein the coil is made of a copper wire, an iron wire or an aluminum wire and comes in contact with a ground electrode,
wherein the adsorbent is formed in a spherical shape or pellet form and is zeolite 13X,
wherein the catalyst is supported on the adsorbent at a mass fraction of 1 to 10 wt% based on the weight of the adsorbent.

2. The ethylene disposal apparatus according to claim 1, wherein the plasma discharge part is made of a quartz tube, a glass tube, an alumina tube or a ceramic tube.

3. The ethylene disposal apparatus according to claim 1, wherein the electrode part extends into an inside passage of the plasma discharge part and is a metal rod arranged coaxially with the plasma discharge part.

4. The ethylene disposal apparatus according to claim 1, wherein the electrode part is connected with a voltage supplying device configured to supply power to the plasma discharge part.

* * * * *